(12) United States Patent
Jung et al.

(10) Patent No.: US 7,547,979 B2
(45) Date of Patent: Jun. 16, 2009

(54) SEMICONDUCTOR DEVICE AND METHOD OF LOCATING A PREDETERMINED POINT ON THE SEMICONDUCTOR DEVICE

(75) Inventors: Jin Kook Jung, Seongnam-si (KR); Hark-Moo Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 225 days.

(21) Appl. No.: 10/822,384

(22) Filed: Apr. 12, 2004

(65) Prior Publication Data

US 2005/0023648 A1    Feb. 3, 2005

(30) Foreign Application Priority Data

Jul. 28, 2003    (KR) .................... 10-2003-0052090

(51) Int. Cl.
    *H01L 23/544* (2006.01)
(52) U.S. Cl. .................... 257/797; 257/E23.179
(58) Field of Classification Search .......... 257/E23.179
    See application file for complete search history.

(56) References Cited

U.S. PATENT DOCUMENTS

| | | | | |
|---|---|---|---|---|
| 5,854,125 A | * | 12/1998 | Harvey | ............ 438/626 |
| 6,506,623 B2 | * | 1/2003 | Teshima et al. | ............ 438/73 |
| 6,603,162 B1 | * | 8/2003 | Uchiyama et al. | ............ 257/296 |
| 6,693,357 B1 | * | 2/2004 | Borst et al. | ............ 257/773 |
| 2001/0022399 A1 | * | 9/2001 | Koubuchi et al. | ............ 257/758 |
| 2002/0061608 A1 | * | 5/2002 | Kuroda et al. | ............ 438/129 |
| 2002/0175419 A1 | * | 11/2002 | Wang et al. | ............ 257/774 |
| 2003/0044059 A1 | * | 3/2003 | Chang et al. | ............ 382/149 |
| 2004/0033689 A1 | * | 2/2004 | Ho et al. | ............ 438/687 |
| 2005/0161837 A1 | * | 7/2005 | Matsui | ............ 257/797 |

FOREIGN PATENT DOCUMENTS

KR    0038153    5/2001

OTHER PUBLICATIONS

English Abstract.

* cited by examiner

*Primary Examiner*—Evan Pert
*Assistant Examiner*—Ben P Sandvik
(74) *Attorney, Agent, or Firm*—F. Chau & Associates, LLC

(57) ABSTRACT

Marking lines or patterns are formed among dummy patterns or on a reference plain of a semiconductor device requiring analysis to enable easy location of a point on the semiconductor device.

5 Claims, 6 Drawing Sheets

SEMICONDUCTOR DEVICE AND METHOD OF LOCATING A PREDETERMINED POINT ON THE SEMICONDUCTOR DEVICE

BACKGROUND

This application claims priority based on Korean Patent Application No. 2003-52090, filed on Jul. 28, 2003, in the Korean Intellectual Property Office, the disclosure of which is incorporated herein in its entirety by reference.

1. Technical Field

The present disclosure relates to a semiconductor device, and more particularly, to a semiconductor device having a plurality of identical patterns in one plane.

2. Discussion of Related Art

Defect analysis is performed during the manufacture of semiconductor devices to provide quality control and ultimately increase yield. Defect analysis is performed using a microscope, a focused ion beam (FIB), a scanning electron microscope (SEM), or an e-beam probe. These devices are used to find a desired point with a ruler and to enlarge the point and check for defects or a desired pattern. When a defect is anticipated or found near a specific pattern, the next step is to examine the vicinity and determine the cause of the defect. However, since semiconductor devices are made up of identical structures arranged in repeating patterns, it is often very difficult to find a specific location in a semiconductor device.

Since semiconductor devices are now being formed with up to 6 or 7 layers of metal wiring stacked on top of one another, chemical mechanical polishing (CMP) technology has increased in importance. Accordingly, the practice of forming identical dummy patterns 10 on a top layer, as shown in FIG. 1, has increased. As is well-known in the art, dummy patterns are intended to reduce dishing in a CMP process by reducing differences in pattern density.

When a ruler of a test device is used to search for a desired point on a semiconductor device according to conventional methods, it is sometimes very difficult to locate the exact point if a distance to the point becomes too great. In the dummy patterns of FIG. 1, the point is located from a certain pad that is visible to the naked eye with the aid of a magnifying device (pads are usually larger than dummy patterns), or from a certain inner chip with a ruler. However, the number of dummy patterns etc. that must be counted to find a desired point on the semiconductor device naturally increases with the distance to the desired point, and there is a high probability of error when counting dozens or hundreds of dummy patterns, and checking pads and inner chips, just by looking at a screen of the test device.

In addition, if milling with an FIB is done in the wrong place, even only slightly off from the desired point, it can ruin a sample and cause a serious problem. For example, FIG. 2 shows a metal line pattern arrangement in which electrical characteristics of a first wire 20 are to be checked by milling a point A and filling it with metal. If, by mistake, a point B is milled and filled with metal, a short between the first wire 20 and a second wire 30 occurs and the sample is ruined.

Furthermore, in recently developed high-performance semiconductor devices or semiconductor devices that have high power consumption, a reference plain 50 is used to smoothly supply power to the top layer, as shown in FIG. 3. For example, the reference plain 50 is used in a high-speed central processing unit (CPU). The reference plain 50 is formed as one metal plain dotted with via holes 55 for connection to a lower layer. Here, since the via holes 55 have a uniform pattern across the reference plain 50, similar to the dummy patterns 10 of FIG. 1, it is very difficult to find an exact point that is far away from pads using a test device according to conventional methods.

Moreover, line width is constantly being reduced by ongoing improvement in techniques for manufacturing semiconductor devices. This reduction of line width makes finding exact points on semiconductor devices increasingly difficult.

Accordingly, there is a need for a semiconductor device in which a defect or a desired point can be easily located and analyzed.

SUMMARY OF THE INVENTION

A semiconductor device according to an embodiment of the invention includes a semiconductor substrate, dummy patterns that are formed in a uniform pattern over the semiconductor substrate, and marking patterns that are formed over the semiconductor substrate to correspond to predetermined groups of the dummy patterns.

A semiconductor device according to another embodiment of the invention includes a semiconductor substrate, dummy patterns that are formed in a uniform pattern over the semiconductor substrate, and marking lines that divide the dummy patterns into a plurality of groups.

A semiconductor device according to another embodiment of the invention includes a semiconductor substrate, a reference plain that covers the semiconductor substrate, and marking lines that divide the reference plain into a plurality of groups.

According to an aspect of the present invention, there is provided a method of locating a predetermined point on a semiconductor device. The semiconductor device includes a semiconductor substrate, dummy patterns for a chemical mechanical polishing (CMP) method formed in a uniform pattern over the semiconductor substrate, and marking patterns that are formed over the semiconductor substrate to correspond to predetermined groups of the dummy patterns. The method includes counting a number of the marking patterns from a first marking pattern closest to a reference point to a second marking pattern closest to the predetermined point, and counting a number of the dummy patterns from a first dummy pattern closest to the second marking pattern to a second dummy pattern closest to the predetermined point.

According to another aspect of the present invention, there is provided a method of locating a predetermined point on a semiconductor device, the semiconductor device comprising a semiconductor substrate, a reference plain that covers the semiconductor substrate, the reference plain comprising a plurality of via holes, and marking lines that divide the reference plain into a plurality of groups of the via holes. The method includes counting a number of the marking lines from a first marking line closest to a reference point to a second marking line closest to the predetermined point, and counting a number of the via holes from a first via hole closest to the second marking line to a second via hole closest to the predetermined point.

BRIEF DESCRIPTION OF THE DRAWINGS

Exemplary embodiments of the present invention will be described in detail with reference to the attached drawings in which.

DESCRIPTION OF PREFERRED EMBODIMENTS

Figure 1:
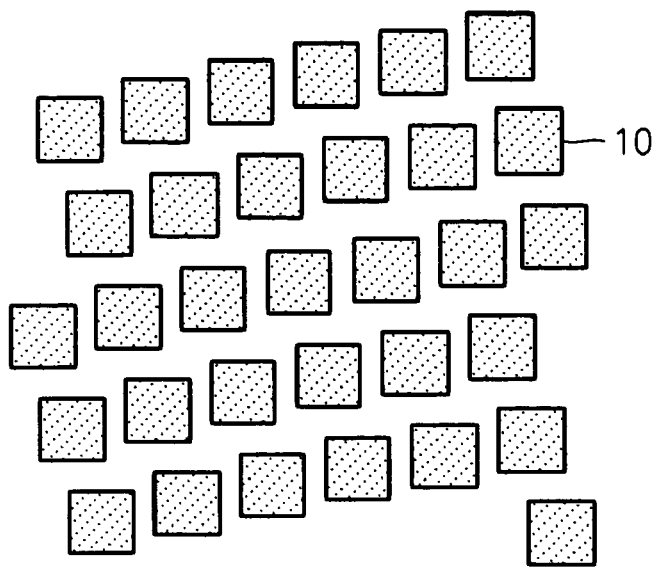
FIG. 1 is a plan view of an arrangement of conventional dummy patterns.
Figure 2:
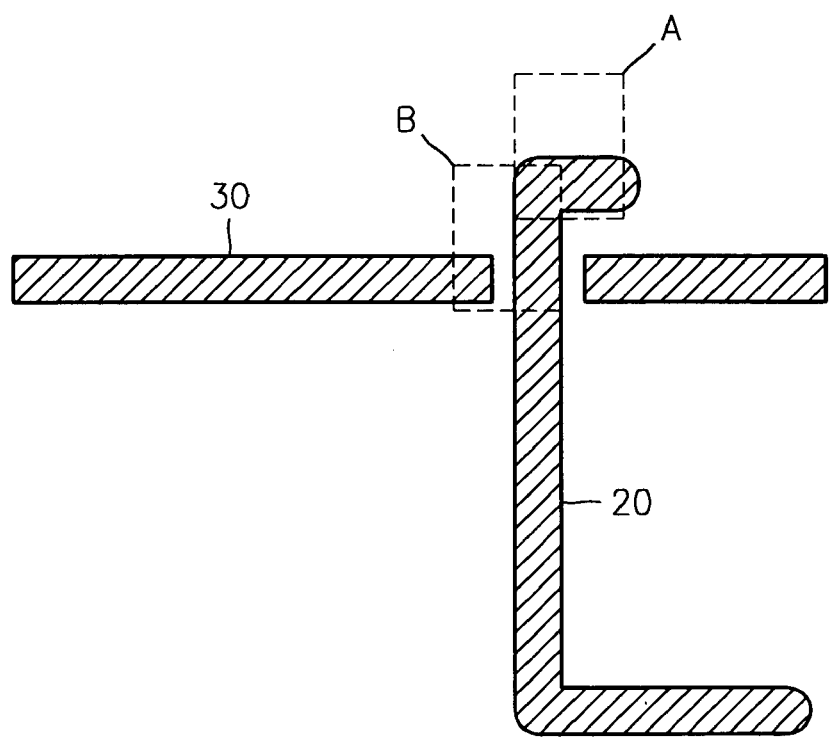
FIG. 2 is a plan view of a metal line pattern arrangement.
Figure 3:
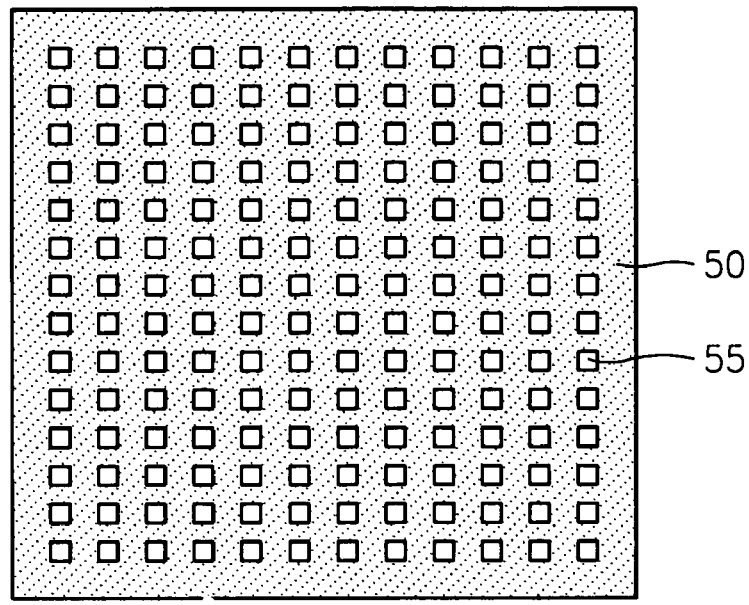
FIG. 3 is a plan view of a conventional reference plain used in a top layer of a high-performance or high-power consumption semiconductor device.

The present invention will now be described more fully with reference to the attached drawings, in which exemplary embodiments thereof are shown. This invention may, however, be embodied in many different forms and should not be construed as being limited to the embodiments set forth herein; rather these embodiments are provided so that this disclosure will be thorough and complete, and will fully convey the concept of the invention to those skilled in the art. In the drawings, the shapes and sizes of regions and elements may be exaggerated for clarity, and like reference numerals denote like elements. It will also be understood that when a layer is referred to as being "on" another layer or substrate, it can be directly on the other layer or substrate, or intervening layers may also be present.

Figure 4:
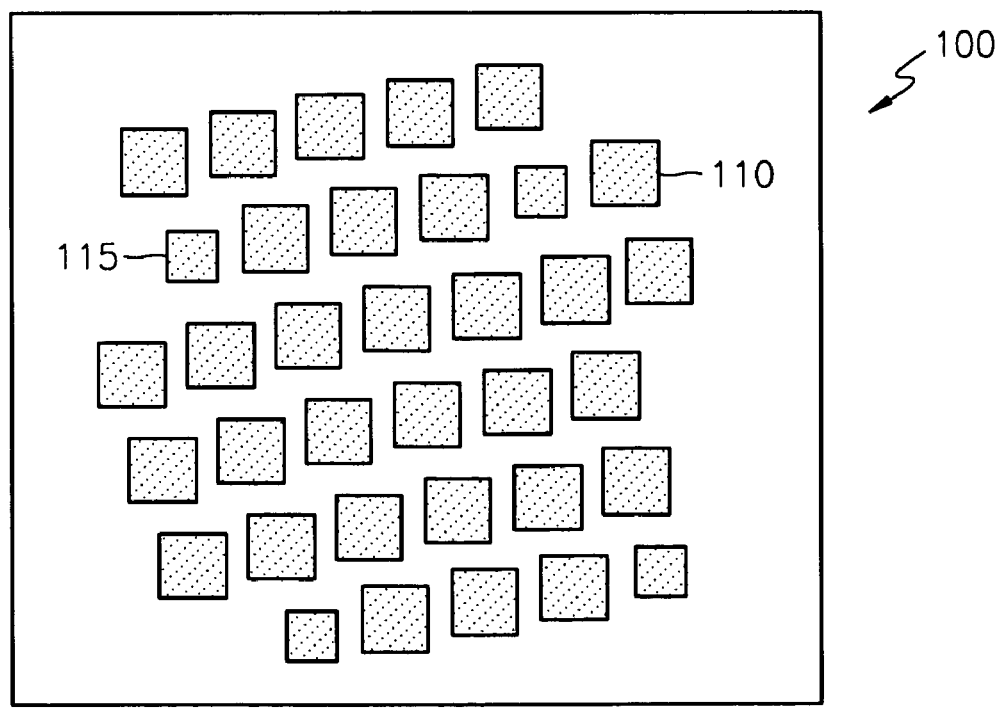
FIG. 4 is a plan view of a semiconductor device having a dummy pattern arrangement according to an embodiment of the present invention.
Figure 5:
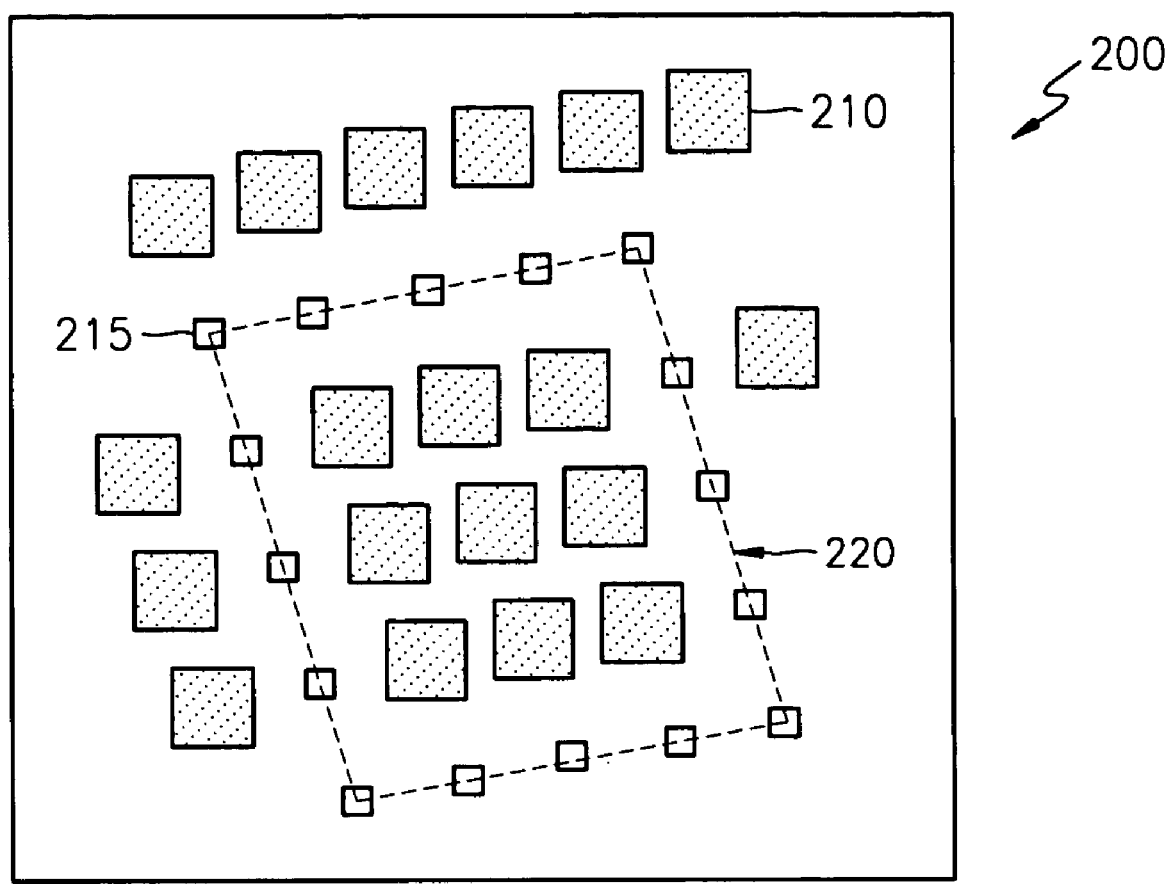
FIG. 5 is a plan view of a semiconductor device having a dummy pattern arrangement according to another embodiment of the present invention.
Figure 6:
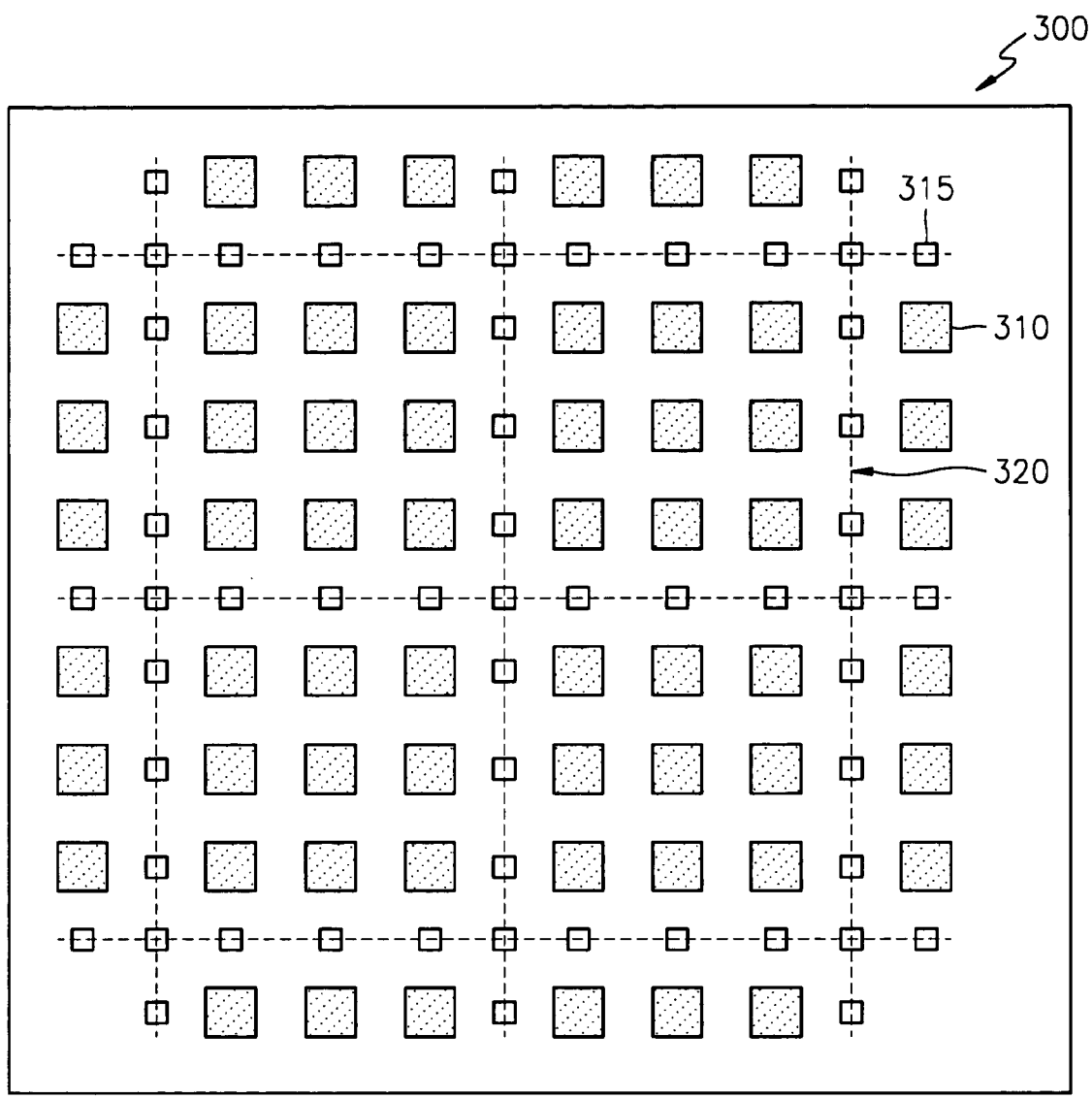
FIG. 6 is a plan view of a semiconductor device having a dummy pattern arrangement according to another embodiment of the present invention.

FIGS. 4 through 6 are plan views of a semiconductor device having a dummy pattern arrangement according to an exemplary embodiments of the present invention. In the embodiments of the invention shown in FIGS. 4 through 6, the semiconductor device has sets of dummy patterns with different sizes and shapes in order to easily locate a defect or a desired point using a test device.

FIG. 4 shows a semiconductor device having a dummy pattern arrangement according to an exemplary embodiment of the present invention. Reference numeral 110 denotes top level dummy patterns that are regularly arranged on a semiconductor substrate 100. The dummy patterns 110 are formed in preparation for chemical mechanical polishing (CMP). A grid of marking patterns 115 is disposed among the dummy patterns 110 to easily find a desired point.

The marking patterns 115 are formed to be different from the dummy patterns 110 in terms of size and/or shape, so as to distinguish the marking patterns 115 from the dummy patterns 110. In the present embodiment of the invention, the marking patterns 115 are formed to be smaller than the dummy patterns 110.

The marking patterns 115 are formed in a regular grid pattern in which they are spaced apart by intervals of a predetermined number of dummy patterns 110. In the embodiment of the invention shown in FIG. 4, the marking patterns 115 are formed at intervals of 3 dummy patterns 110, however the length of the intervals can be any number of dummy patterns 110 deemed appropriate. Thus, when attempting to locate a desired point on the semiconductor device, the marking patterns 115 can be counted instead of individual dummy patterns 110. This makes locating the desired point easier and more reliable than the conventional method of counting individual dummy patterns 110.

For instance, when a point at a $163^{rd}$ dummy pattern from a pad (not shown) is searched for, the conventional method would require counting 163 individual dummy patterns. However, if the marking patterns 115 are formed at intervals of, for example, twenty dummy patterns 110, the point at the $163^{rd}$ dummy pattern can be found by counting only eight marking patterns 115 and three dummy patterns 110.

FIG. 5 is a plan view of a semiconductor device having a dummy pattern arrangement according to another exemplary embodiment of the present invention. The semiconductor device in FIG. 5 includes marking lines 220 dividing an area of uniformly arranged top level dummy patterns 210, formed for chemical mechanical polishing (CMP), into a plurality of groups. The marking lines 220 and top level dummy patterns 210 are formed over a semiconductor substrate 200. The marking lines 220 may be formed of marking patterns 215 that have a different size and/or shape from the dummy patterns 210 and surround blocks of the dummy patterns 210. In FIG. 5, the marking patterns 215 are smaller than, but the same shape as, the dummy patterns 210. However, it should be appreciated that in other exemplary embodiments of the invention, the marking patterns 215 can have any size and shape, as long as they can divide the dummy patterns 210 into a plurality of groups.

FIG. 6 is a plan view of a semiconductor device having a dummy pattern arrangement according to another embodiment of the present invention. Marking lines 320 formed of marking patterns 315 that have a different size and/or shape from dummy patterns 310 are provided in the shape of a grid. The marking patterns 315 and dummy patterns 310 are formed over a semiconductor substrate 300. In FIG. 6, the marking patterns 315 are smaller, but the same shape as, the dummy patterns 310. In FIG. 6, the marking lines 320 demarcate 3×3 blocks of dummy patterns 310. However, it should be appreciated that in other exemplary embodiments of the invention, the groups of dummy patterns 310 enclosed by the marking lines 320 can be any size deemed appropriate.

Figure 7:
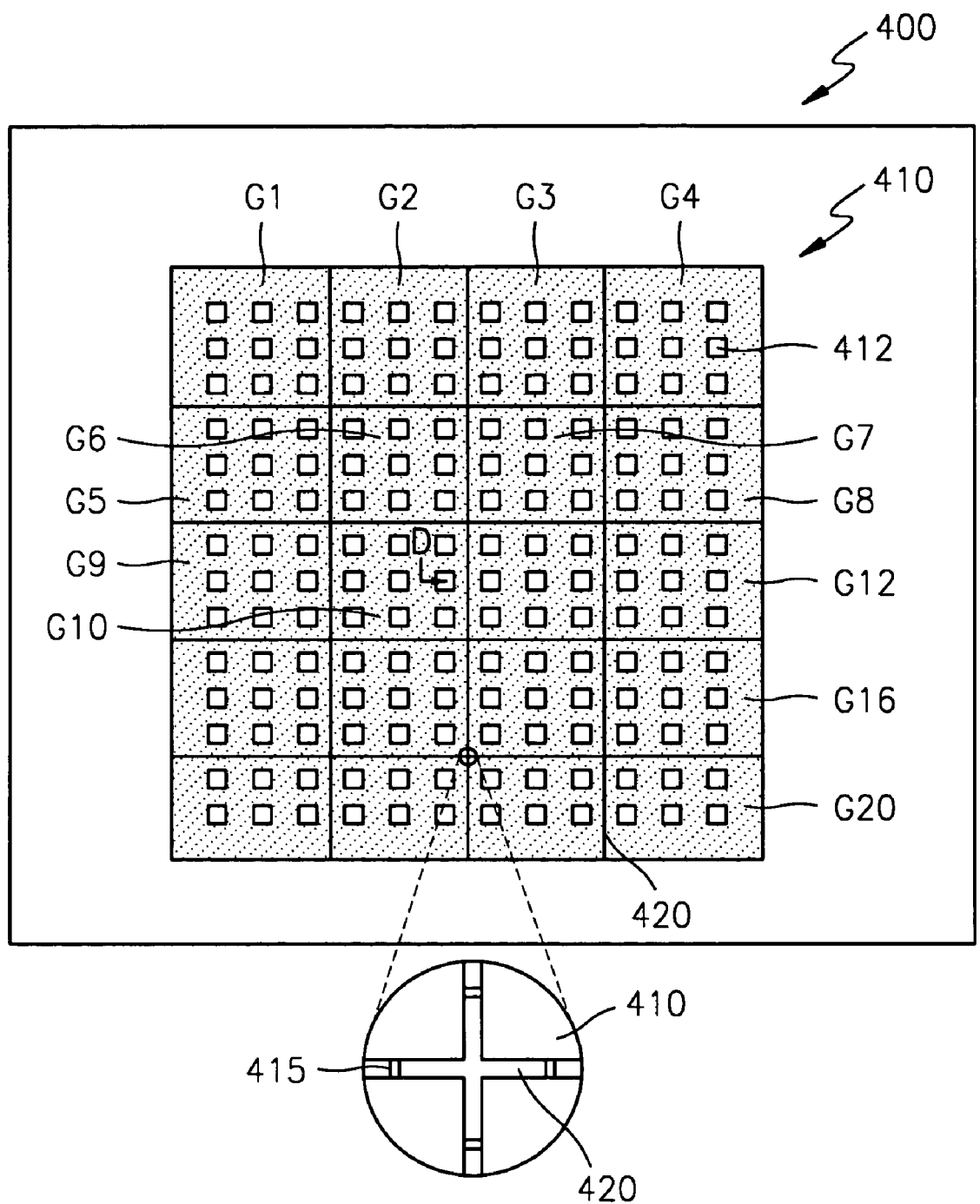
FIG. 7 is a plan view of a semiconductor device having a reference plain according to another embodiment of the present invention.
Figure 8:
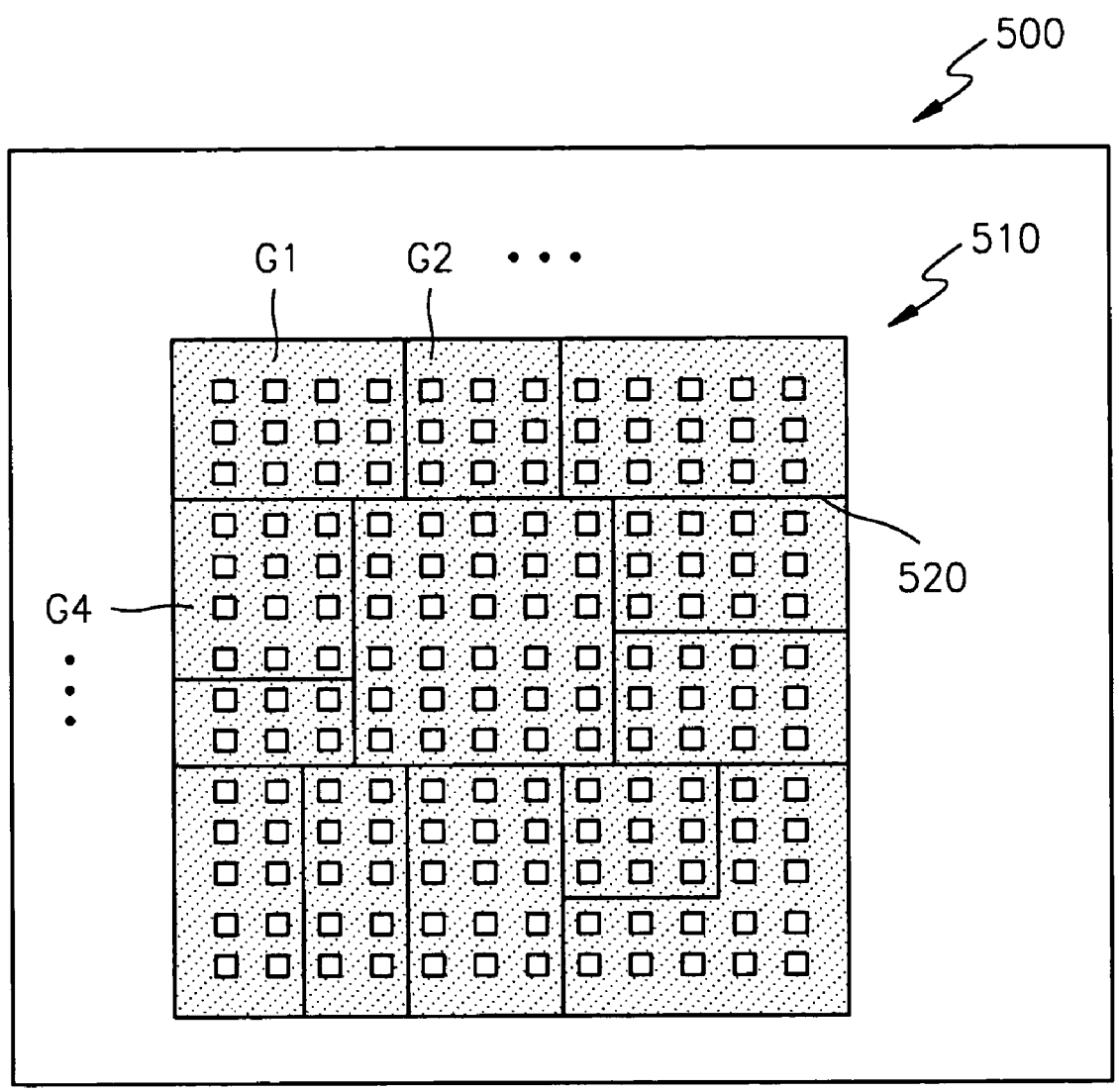
FIG. 8 is a plan view of a semiconductor device having a reference plain according to another embodiment of the present invention.

FIGS. 7 and 8 are plan views of a semiconductor device having a reference plain according exemplary embodiments of the present invention. In the embodiments of the invention shown in FIGS. 7 and 8, the semiconductor device has coordinate lines that are utilized to easily find a defect or desired point on the semiconductor device using a test device.

FIG. 7 is a plan view of a semiconductor device having a reference plain according to an exemplary embodiment of the present invention. A reference plain 410 according to the present embodiment of the invention includes marking lines 420 dividing the reference plain 410 into a plurality of groups G1, G2, ..., G20. The reference plain 410 is formed over a semiconductor substrate 400. If the plurality of groups G1, G2, ..., G20 each consist of a set number of via holes 412, or have the same dimensions, for example 200 μm×200 μm, the reference plain 410 will take the shape of a grid. Then, a desired point can be easily located, even in the middle of the chip, using a test device such as a focused ion beam (FIB). Here, it is preferable that the plurality of groups G1, G2, ..., G20 have portions 415 that electrically connect the groups. In FIG. 7 the marking lines 420 demarcate 3×3 blocks of via holes 412. However, it should be appreciated that in other exemplary embodiments of the invention, the groups of via holes 412 enclosed by the marking lines 320 can be any size deemed appropriate.

Analyzing a defect "D" occurring in group G10 of the semiconductor device shown in FIG. 7 to determine its cause will now be explained. First, the defect "D" is located using a microscope. Here, the marking lines 420 make it is easy to find the defect "D". For instance, if the defect "D" is at a $50^{th}$ via hole 412 from a pad (not shown), the defect "D" can be easily located by counting only 16 marking lines 420 and two via holes 412, rather than counting all fifty via holes 412.

FIG. 8 is a plan view of a semiconductor device having a reference plain according to another exemplary embodiment of the present invention. As shown in FIG. 8, a plurality of groups G1, G2, . . . demarcated by markings lines 520 of a reference plain 510 formed over a semiconductor substrate 500 may have different sizes and/or shapes. Thus, instead of counting individual dummy patterns, a defect can be easily located by relying on the groups of different sizes and/or shapes.

As described above, the semiconductor device according to the present invention enables easy and reliable location of a defect or desired point among dummy patterns or via holes, by using marking patterns, marking lines formed of marking patterns, or a grid-patterned reference plain. Such easy and reliable location of defects or desired points enhances efficiency and yield in manufacturing semiconductor devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
a semiconductor substrate;
dummy patterns for a chemical mechanical polishing (CMP) method formed in a uniform pattern over the semiconductor substrate; and
marking patterns that are formed over the semiconductor substrate to correspond to predetermined groups of the dummy patterns,
wherein at least one dummy pattern is formed between two marking patterns,
wherein a number of the dummy patterns is substantially greater than a number of the marking patterns, wherein the marking patterns are smaller than the dummy patterns.

2. The semiconductor device of claim 1, wherein the marking patterns have a different shape from the dummy patterns.

3. The semiconductor device of claim 1, wherein the marking patterns have a different size from the dummy patterns.

4. A semiconductor device comprising:
a semiconductor substrate;
dummy patterns for a chemical mechanical polishing (CMP) method formed in a uniform pattern over the semiconductor substrate; and
marking patterns that are formed over the semiconductor substrate to correspond to predetermined groups of the dummy patterns,
wherein the marking patterns surround at least a group of dummy patterns, wherein a size of the marking patterns is smaller than a size of the dummy patterns.

5. A semiconductor device comprising:
a semiconductor substrate;
dummy patterns for a chemical mechanical polishing (CMP) method formed in a uniform pattern over the semiconductor substrate; and
marking patterns that group predetermined plural numbers of the dummy patterns and are formed over the semiconductor substrate;
wherein the marking patterns and the predetermined plural numbers of the dummy patterns grouped by the marking patterns form a unit, which is repeated.

* * * * *